(12) United States Patent
Gossner

(10) Patent No.: US 7,470,957 B2
(45) Date of Patent: Dec. 30, 2008

(54) ELECTROSTATIC DISCHARGE PROTECTION

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 412 days.

(21) Appl. No.: 11/324,995

(22) Filed: Jan. 3, 2006

(65) Prior Publication Data

US 2006/0145261 A1    Jul. 6, 2006

(30) Foreign Application Priority Data

Jan. 5, 2005    (DE) ........................ 10 2005 000 801

(51) Int. Cl.
*H01L 27/12* (2006.01)
*H01L 31/0392* (2006.01)

(52) U.S. Cl. ....................... 257/355; 257/358
(58) Field of Classification Search .......... 257/355–363
See application file for complete search history.

(56) References Cited

U.S. PATENT DOCUMENTS

| | | | |
|---|---|---|---|
| 5,734,541 A | | 3/1998 | Iniewski et al. |
| 6,707,109 B2 * | | 3/2004 | Hayashida ................. 257/355 |
| 7,205,611 B2 * | | 4/2007 | Honjoh et al. ............... 257/355 |
| 7,288,820 B2 * | | 10/2007 | Baird et al. .................. 257/355 |
| 2002/0153571 A1 | | 10/2002 | Mergens et al. |
| 2004/0021998 A1 | | 2/2004 | Salome et al. |

OTHER PUBLICATIONS

Markus P.J. Mergens, Christian C. Russ, Koen G. Verhaege, John Armer, Phillip C. Jozwiak, Russ Mohn; "High Holding Current SCRs (HHI-SCR) for ESD Protection and Latch-up Immune IC Operation"; Sarnoff Corporation and ESD Association; Princeton, NJ.*
F. Azaïs, B. Caillard, S. Dournelle, P. Nouet, and P. Salomé;; "A novel SCR-based protection structure against ESD with efficient multifinger triggering"; LIRMM, University Montpellier II/CNRS, Montpellier, France; STMicroelectronics, Central R7D, Corlles, France.*

* cited by examiner

*Primary Examiner*—Cuong Q Nguyen
(74) *Attorney, Agent, or Firm*—Brinks Hofer Gilson & Lione

(57) ABSTRACT

An electrostatic discharge ("ESD") protection device, which includes a thyristor circuit, in the ESD case increases a resistance of the ESD protection device in comparison with a non-ESD case, by means of a switch. An ESD protection arrangement may include a ESD protection device to protects circuits with multiple voltage potentials. An ESD protection system may also include an ESD protection arrangement, to which an ESD signal is fed via a bus of the ESD protection system. The ESD protection device and ESD protection arrangement, and thus the ESD protection system, can be provided in a compact semiconductor arrangement.

36 Claims, 10 Drawing Sheets

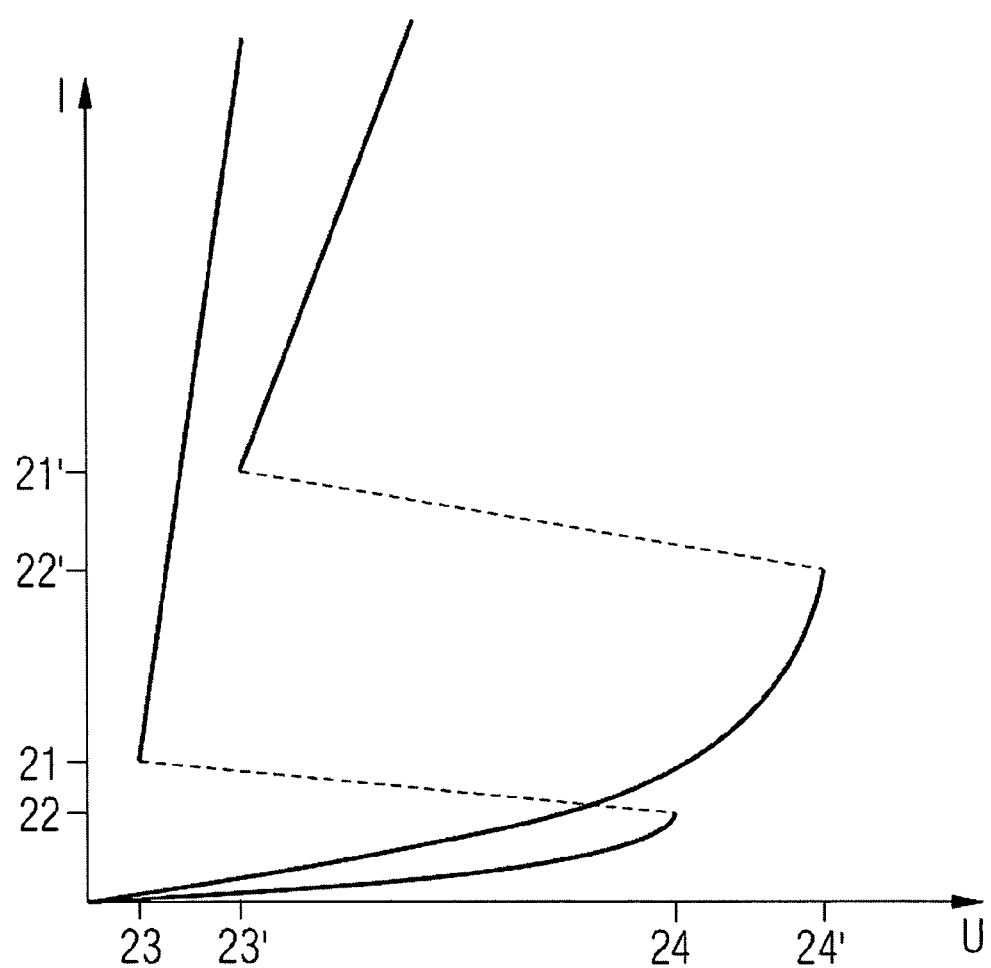

ELECTROSTATIC DISCHARGE PROTECTION

PRIORITY AND CROSS REFERENCE TO RELATED APPLICATION

This application claims priority to German Patent Application No. 10 2005 000 801.1, filed Jan. 5, 2005, entitled DEVICE, ARRANGEMENT AND SYSTEM FOR ESD PROTECTION, which is incorporated in its entirety herein by reference.

BACKGROUND OF THE INVENTION

1. Field of the Invention

The present invention relates to an electrostatic discharge ("ESD") protection device, an ESD protection arrangement and an ESD protection system, to protect a micro-electronic circuit or semiconductor circuit from electrostatic discharge. This invention also relates to a semiconductor circuit having the ESD protection device, the ESD protection arrangement or the ESD protection system.

2. Description of the Related Art

Controllable rectifiers, or thyristors, are used for protection from electrostatic discharges (the ESD case). An advantage of thyristors is that they support a high current density before damage to the thyristor occurs in an ESD case, the ESD case being present when an electrostatic discharge occurs. Also, thyristors hold a constant voltage even in conditions of a high current flow. Thyristors thus provide good protection for a circuit from the ESD case.

A prior art thyristor circuit 1 or ESD protection device is shown in FIG. 1a. A first terminal 27 of the thyristor circuit 1 is connected to the emitter of a PNP transistor 25, and via an n-well resistor 11 to the base of the PNP transistor 25 and the collector of an NPN transistor 26. The collector of the PNP transistor 25 is connected to the base of the NPN transistor 26 and via a p-well resistor 12 to a second terminal 28 of the thyristor circuit 1. The emitter of the NPN transistor 26 is also connected to the second terminal 28.

The method of functioning of the thyristor circuit 1 shown in FIG. 1a is explained using a current-voltage characteristic curve of FIG. 1b. If a voltage which is higher than a switching voltage 24 occurs between the terminals 27, 28 of the thyristor circuit 1, the thyristor circuit 1 passes into a low-resistance region, which begins at a point which is identified by a holding voltage 23 and a holding current 21, so that the current through the thyristor circuit 1 increases greatly. The thyristor circuit 1 is able to divert the energy of an electrostatic discharge so that this energy does not damage the circuit to be protected. After this energy is diverted, the voltage that is present at the thyristor circuit 1 should fall below the holding voltage 23, and the current which flows through the thyristor circuit 1 should fall below the holding current 21, so that the thyristor circuit 1 returns or falls back to a high-resistance region.

There may be two problems in prior art thyristor circuits. First, they often have a very high switching voltage 24, with the result that the circuit to be protected is damaged before the thyristor reaches the conducting state region (region in which the thyristor 1 has low resistance). Second, the holding voltage 23 of the thyristor 1 can be in a range that also includes the operating voltage of the circuit to be protected. The holding voltage then limits the conducting state region downward (see FIG. 1b). If the voltage that is present at the thyristor 1, which is operated in the conducting state region, does not fall below the holding voltage, the thyristor 1 remains in the conducting state region, which is undesirable because malfunctions or even destruction of a circuit to be protected may occur. The second problem is particularly disadvantageous circuits that are operated at 3 to 5 V or higher and are to be protected.

There are several known solutions to address second problem, also called latching. On the one hand, two or more thyristors are connected one behind the other (see FIG. 2a). On the other hand, multiple forward biased diodes are connected in series in front of the thyristor (see FIG. 2b). However, these approaches result in a higher resistance when the thyristor is operated in the conducting state region, which is disadvantageous for the circuit to be protected, since a higher current then flows through the circuit in the ESD case. These approaches also require more components, so that if they are in the form of semiconductor elements, they require a greater area.

In FIG. 3, a current-voltage characteristic curve for the previously discussed approaches is shown (see FIG. 2). In comparison with the thyristor circuit 1 shown in FIG. 1a, the current-voltage characteristic curve shown in FIG. 1b and for comparison also in FIG. 3, a higher holding voltage 24' and also a higher switching current 22' are present, so that the protective effect is affected.

Another approach consists of raising the tripping current, and thus the holding current of the thyristor. If system requirements for the circuit to be protected are that a particular maximum current value cannot be exceeded, and this current value is below the holding current, latching can be avoided. However, this approach has the disadvantage that the thyristor in ESD cases with small or even medium voltage swings does not fire, so that there is insufficient protection for the circuit to be protected. There are also certain circuits to be protected where the system requirements do not limit a maximum current value, for which reason this solution approach cannot be carried out for these circuits.

It is therefore an object of this invention to provide an ESD protection with which the problems and disadvantages described above do not occur and are not present.

SUMMARY OF THE INVENTION

An ESD protection device may be connected between a first line and a second line, and includes a thyristor, which is also to be connected to the first and second lines. An ESD signal, having two different values or potentials, is fed to the ESD protection device. In an ESD case, (i.e., when an electrostatic discharge occurs) the ESD signal has a different potential from when there is no ESD case. When the ESD protection device captures the ESD case through the ESD signal, the ESD protection device raises a resistance of the ESD protection device in comparison with a case in which the ESD case is not present.

By the resistance of the ESD protection device being raised, a breakdown of the thyristor is additionally excited (i.e., by the initial raising of the resistance) in particular an n-well resistance or p-well resistance of the thyristor. The thyristor is put into a state in which the so-called thyristor effect occurs even under a small switching voltage and/or a small switching current. Since, in addition, the resistance is reduced again if it is signaled via the ESD signal that the ESD case is not (or no longer) present, latching is also avoided. This means that by the resistance of the thyristor being reduced again, the holding voltage of the thyristor is moved into a range such that the normal operating voltage of the circuit which is to be protected by the ESD protection device is below this holding voltage, or the holding current is brought to a level which the system cannot provide, so that the thyristor returns to the high-resistance state after diverting a surge.

In particular, the control occurs using a switch of the ESD protection device, by which the resistance that is present either between a first terminal of the thyristor, which can be connected to the first line, and a first point within the thyristor, or between a second terminal of the thyristor, which can be connected to the second line, and a second point within the thyristor, has a small resistance value when the switch is closed, and a high resistance value when the switch is open. Simultaneously, the ESD signal controls the base of a transistor that is present in the thyristor, in such a way that the ESD protection device is initiated. It is particularly advantageous that both the resistance and the base of the transistors are controlled only by the ESD signal. This makes compact implementation of the ESD protection device and reliable control of the ESD protection device possible.

Control is initiated by the ESD signal from the ESD protection device. In other words, an electrical connection between a specified (first or second) terminal of the thyristor and a specified (first or second) point within the thyristor is interrupted by the open switch, so that the resistance between the specified terminal and the specified point has a higher value than when the switch is closed. This change of the resistance value using the switch, which is, in particular, a transistor, is advantageously very robust and simple to implement.

In an embodiment, the thyristor includes a first transistor of a first conduction type, particularly a PNP transistor, and a second transistor of a second conduction type which is different from the first conduction type, particularly an NPN transistor. The first terminal of the thyristor is connected to the emitter of the first transistor, and via the switch of the ESD protection device to the control input of the first transistor and the collector of the second transistor. Additionally, the collector of the first transistor is connected to the control input of the second transistor, the second terminal of the thyristor and the emitter of the second transistor. The switch is opened in the ESD case by the ESD signal, and the thyristor in the ESD case is controlled by means of the ESD signal to become conductive, whereas the switch in the non-ESD case, i.e. the ESD case is not present, is closed by the ESD signal.

According to the invention, the two transistors of the thyristor are preferably a PNP transistor and an NPN transistor. However, they can also be other transistors with different conduction type, for instance a PMOS transistor and an NMOS transistor.

By the switch (e.g., a transistor) being open in the ESD case, the resistance between the first terminal of the thyristor and the control input of the first transistor and the resistance between the first terminal of the thyristor and the collector of the second transistor are magnified compared with a state in which the switch is closed. Because a switch, such as a transistor, is simple to implement particularly in the case of semiconductor circuits, the ESD protection device according to the invention can be advantageously produced with only a very small surface overhead compared with a normal thyristor (without a switch), but nevertheless provides the advantages described above regarding improved conditions for becoming conductive and regarding the avoidance of latching compared with a normal thyristor (without a switch).

In the case of the first and second lines, the potential of the first line is, in particular, above the potential of the second line. The first and second lines can also be supply voltage lines. However, other combinations are also possible. For instance, the first line can be an input/output connection of a circuit to be protected from ESD (i.e., the ESD protection device according to the invention) has the task of diverting a surge on this input/output connection via the second line before the circuit to be protected is damaged.

Additionally, there is an embodiment in which the ESD protection device includes a control device that captures the ESD case between the first and second lines, and is thus able to generate the ESD signal. Advantageously, consequently in the case of this embodiment, the ESD signal does not have to be fed to the ESD protection device.

Within this invention, an ESD protection arrangement, including at least one of the described ESD protection devices is also provided. The ESD protection arrangement is arranged between exactly as many first lines as it includes ESD protection devices and the second line, an ESD protection device being arranged between each first line and the second line. A further ESD signal can be fed to the ESD protection arrangement, and is passed on by the ESD protection arrangement to each of its ESD protection devices as the ESD signal of that ESD protection device. The further ESD signal can have two different values or potentials. For the case that the ESD case occurs between any first line and the second line, the further ESD signal has a different potential from when there is no ESD case between the first lines on which the ESD protection arrangement is arranged and the second line. The ESD case can be detected on the basis both of exceeding an upper voltage threshold (e.g., breakdown of a suitable Zener diode) and occurrence of critical voltage ramps (RC elements).

The ESD protection arrangement is thus able to divert a surge which occurs on any of the first lines which are assigned to the ESD protection arrangement via the appropriate ESD protection device which is connected to this first line.

Because the ESD protection arrangement according to the invention can also include just one ESD protection device, the ESD protection arrangement in this case corresponds to this one ESD protection device, and the further ESD signal in this case (the ESD protection arrangement includes only one ESD protection device) corresponds to the ESD signal.

The ESD protection arrangement is preferably suitable for protection of circuits which work with multiple different supply voltage potentials, for instance one supply voltage potential between 3 and 5 Volts, one supply voltage potential between 1 and 1.5 Volts and one supply voltage potential connected to earth.

In the case of an embodiment of the ESD protection arrangement, the ESD protection arrangement includes a control device, which captures the ESD case between any first line which is assigned to the ESD protection arrangement and the second line, and generates the further ESD signal accordingly.

Thus, the ESD protection arrangement according to the invention advantageously no longer depends on the further ESD signal being supplied. Within this invention, an ESD protection system, including at least one described ESD protection arrangement is also provided. The ESD protection system is arranged between at least one first line and the second line, in such a way that between each first line and the second line at least one of the ESD protection arrangements of the ESD protection system is arranged. Additionally, each ESD protection arrangement is connected to a bus of the ESD protection system, and the further ESD signal is fed to each ESD protection arrangement via it.

In a preferred embodiment, the ESD protection system includes at least one control system, which similarly to the case of the ESD protection arrangement can be contacted to all first lines and the second line, and generates the further ESD signal and feeds it to the bus.

The ESD protection system according to the invention is thus able to capture the ESD case which occurs between any one of the first lines and the second line, and to divert it via at least one ESD protection arrangement, which, as explained, may also be an ESD protection device. To protect a circuit from surges, the ESD protection system can be in such a form that the ESD protection arrangements and ESD protection devices, and the control devices if any, are arranged somewhere within the circuit to be protected, so that the ESD protection system can be advantageously and flexibly constructed.

The invention is preferably suitable for use in micro-electronic circuits, to protect these micro-electronic circuits from electrostatic discharges. However, the invention is obviously not restricted to this preferred application area, but may also be used in the case of circuits which are constructed using discrete components.

DESCRIPTION OF THE DRAWINGS

The present invention will be further described with reference to the attached drawing on the basis of preferred embodiments. Identical, functionally identical, or similar elements and signals are referred to with the same reference symbols in the figures unless stated otherwise.

FIG. 1b shows a current-voltage characteristic curve associated with the thyristor circuit of FIG. 1a.

FIG. 3 shows a current-voltage characteristic curve of a thyristor circuit according to FIG. 2, with the conventional current-voltage characteristic curve.

DESCRIPTION OF THE PREFERRED EMBODIMENTS

Figure 1A:
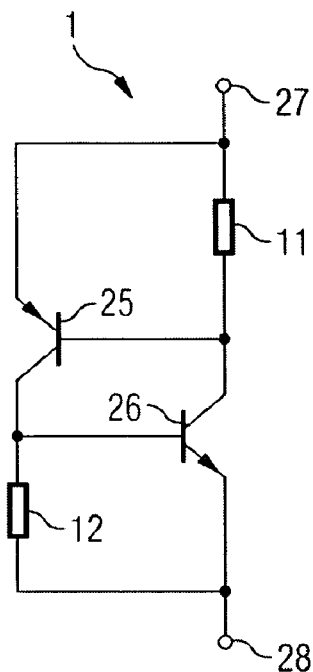
FIG. 1a shows a thyristor circuit according to the prior art.
Figure 1B:
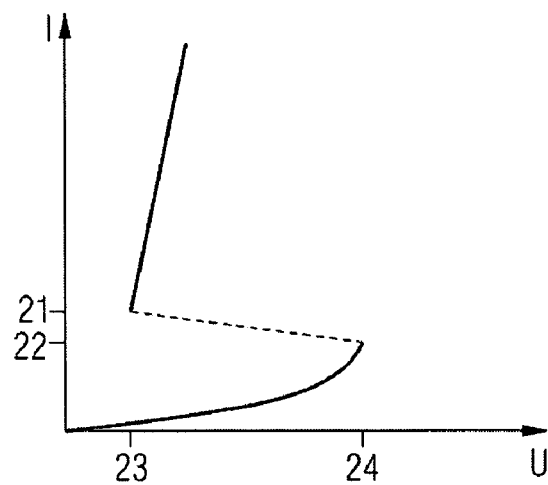
Figure 2A:
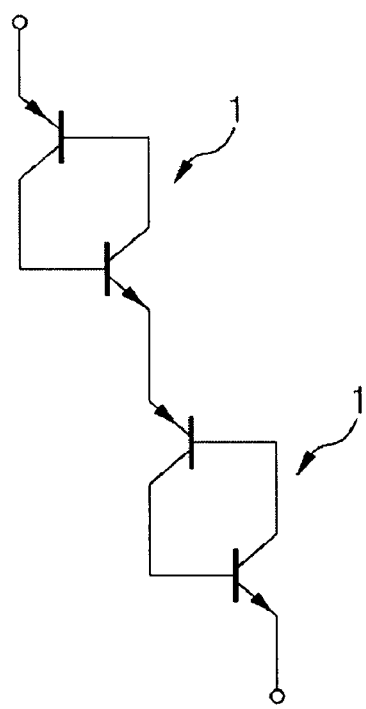
FIG. 2 shows the possibilities that are known according to the prior art for improving thyristor circuits.
Figure 2B:
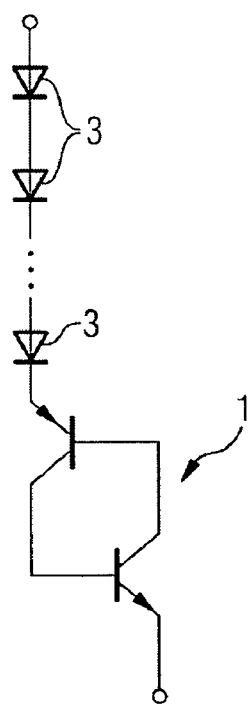
Figure 4A:
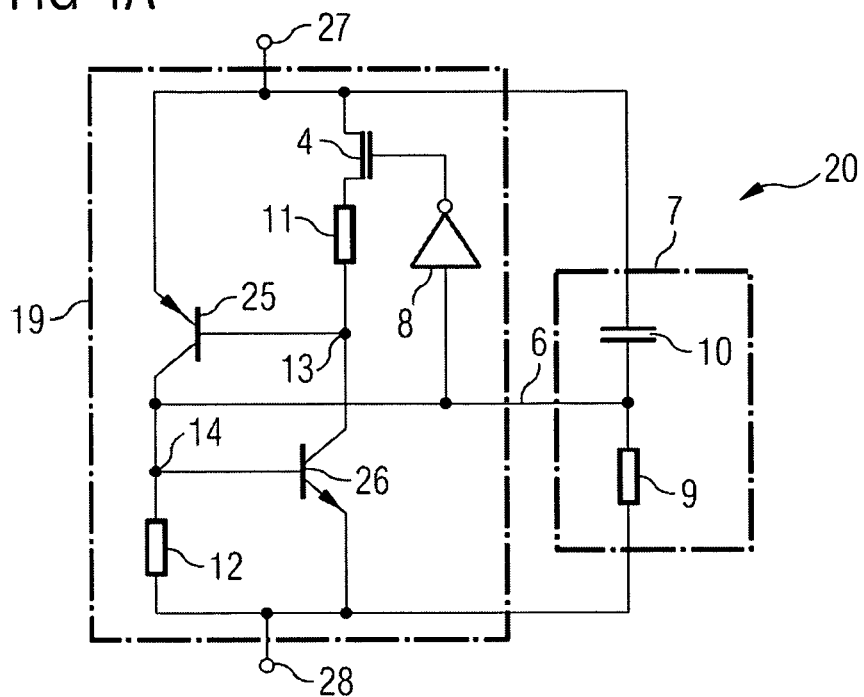
FIG. 4 shows two embodiments of ESD protection devices according to the invention.

FIG. 4a represents an ESD protection device 19 that diverts an electrostatic discharge between a first terminal 27 and a second terminal 28 of the ESD protection device 19, the potential of the first terminal 27 being higher than the potential of the second terminal 28 (for instance, the first terminal 27 can be connected to $V_{DD}$ and the second terminal 28 to $V_{SS}$). The first terminal 27 is connected to the emitter of a PNP transistor 25, and via an NMOS transistor 4 and an n-well resistor 11 to the base of the PNP transistor 25 and the collector of an NPN transistor 26. The collector of the PNP transistor 25 is connected to the base of the NPN transistor 26, to an ESD signal 6 and via a p-well resistor 12 to the second terminal 28. The emitter of the NPN transistor 26 is also connected to the second terminal 28. The ESD signal 6 that is inverted via an inverter 8 controls the NMOS transistor 4. A contact point 13 in front of the base of the PNP transistor 25 is called the n-well contact, and a contact point 14 in front of the base of the NPN transistor 26 is called the p-well contact. The ESD signal 6 is supplied by a control device 7. This control device 7 includes a capacitor 10 and a resistor 9, which are connected in series between the first terminal 27 and the second terminal 28. The ESD signal 6 is tapped between the capacitor 10 and the resistor 9. A reference symbol 20 designates an ESD protection device, which includes the control device 7. In other words, the difference between the ESD protection device 19 and the ESD protection device 20 is that the ESD protection device 20 includes the control device 7, whereas the ESD protection device 19 does not include a control device 7. This means that whereas the ESD protection device 20 itself generates the ESD signal 6, the ESD signal 6 is supplied to the ESD protection device 19.

If an electrostatic discharge or ESD case is captured by the control device 7, the control device 7 sets the ESD signal 6 to a high potential (binary value 1), which is somewhat below a potential ($V_{DD}$) which is present at the first terminal. In this way the base of the NPN transistor 26 is controlled up, and the NMOS transistor 4 is switched off, so that a connection between the first terminal 27 and the n-well contact 13 is high-resistance. This enables the ESD protection device 19 or 20 to switch (come into the conducting state region of the thyristor) quickly even at a low current level, since almost the whole current flows from the first terminal 27 via the emitter-base connection of the PNP transistor 25, since the connection from the first terminal 27 to the base of the PNP transistor 25 is interrupted or high-resistance. In this way, a good ESD protection characteristic is ensured by the ESD protection device 19 or 20.

If the control device 7 does not capture an ESD case, which is the normal operating state, the ESD signal 6 has a low potential (binary value 0), which is near a potential ($V_{SS}$) which is present at the second terminal 28. This means that in the normal operating state the connection from the first terminal 27 to the n-well contact 13 is low-resistance, since the NMOS transistor 4 is closed. This ensures that no latching occurs.

Figure 4B:
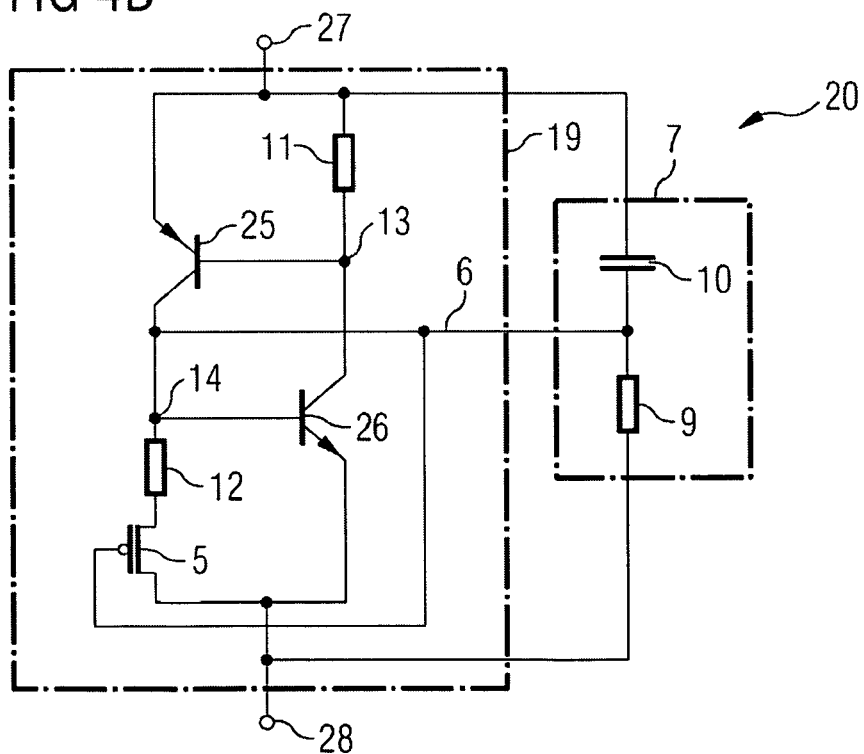

The difference between FIGS. 4a and 4b is that instead of the NMOS transistor 4 between the first terminal 27 and the n-well resistor 11, a PMOS transistor 5 is connected between the second terminal 25 and the p-well resistor 12. In the ESD case (the ESD signal 6 has the binary value 1), the PMOS transistor 5 is opened, so that the connection between the second terminal and the p-well contact 14 is high-resistance. This in turn enables the ESD protection device 19 or 20 to switch quickly at a low current level, since almost the whole current which flows to the second terminal 28 flows via the base-emitter connection of the NPN transistor 26, since the connection from the base of the NPN transistor 26 to the second terminal 28 is interrupted or high-resistance. In this way, as in the case of FIG. 4a, a good ESD protection characteristic is ensured by the ESD protection device 19 or 20 of FIG. 4b.

Figure 5A:
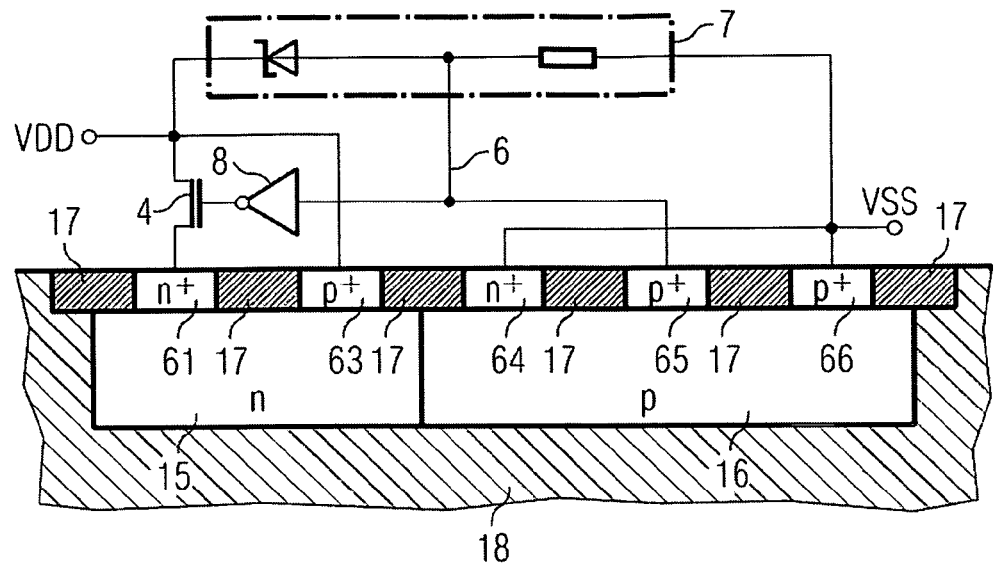
FIG. 5 shows two embodiments of ESD protection devices according to the invention, part of these ESD protection devices being shown as semiconductor structures.

FIG. 5a shows the ESD protection device 19 or 20 of FIG. 4a, a certain proportion of the ESD protection device being represented by semiconductor structures. In a p-substrate 18, an n-well 15 and a p-well 16 are shown directly adjacent to each other, the p-well 16 being arranged on the right next to the n-well 15. The first terminal or $V_{DD}$ is connected via the NMOS transistor 4 to an n+ area 61, which is arranged on the left within the n-well 15. Additionally, the first terminal or $V_{DD}$ is connected to a p+ area 63 (emitter of the PNP transistor), which is arranged on the right, next to the n+ area 61, and separated by an insulation layer 17. The second terminal or $V_{SS}$ is connected to an n+ area 64 (emitter of the NPN transistor), which is arranged on the left in the p-well 16, the p+ area 63 being separated by an insulation layer 17 from the n+ area 64. The ESD signal 6 is connected to a p+ area 65, which is arranged on the right, next to the n+ area 64 in the p-well 16, and separated by an insulation layer 17. The second terminal or $V_{SS}$ is connected to a p+ area 66, which is on the right, next to the p+ area 65 in the p-well 16, and separated by an insulation layer 17. Thus the PNP transistor is formed via the p+ area 63, the n-well 15 and the p-well 16, and the NPN transistor is formed via the n+ area 64, the p-well 16 and the n-well 15.

Because the NMOS transistor 4 is connected to the n-well 15 via the n+ area 61, in the case of the embodiment shown in FIG. 5a the resistance of the connection to the n-well is controlled or switched via the NMOS transistor 4. A semiconductor circuit corresponding to this embodiment can be produced, for instance, using a standard "twinwell process" with a wafer of a p-type.

Figure 5B:
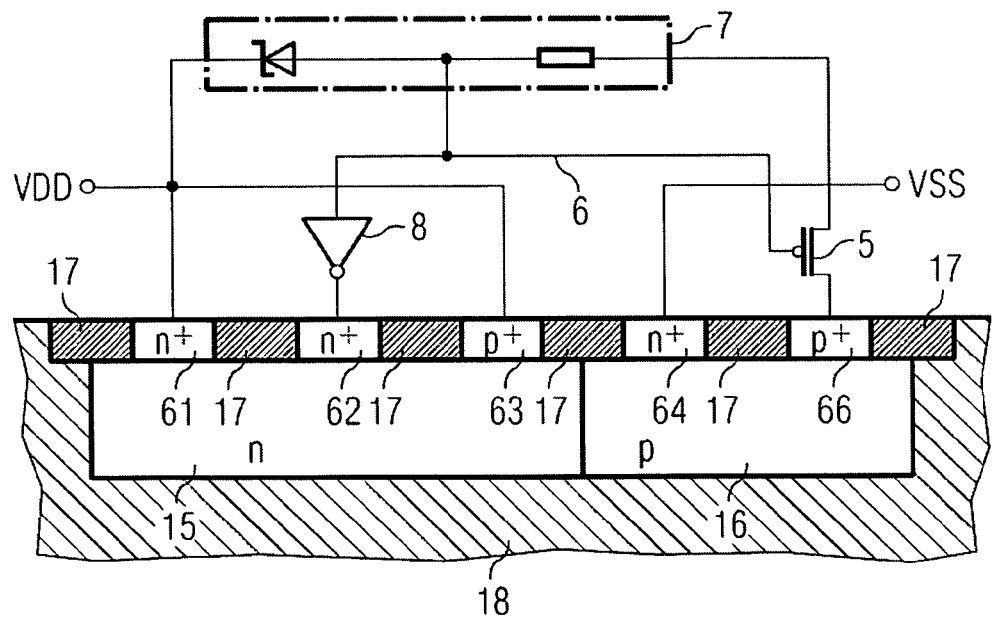

The ESD protection device shown in FIG. 5b is comparable to the one shown in FIG. 5a, for which reason only the differences are explained below. Instead of feeding the ESD signal 6 via the p+ area 65, an inverted ESD signal 6 is fed to another n+ area 62 which is arranged in the n-well 15 between the n+ area 61 and the p+ area 63 and insulated by insulation layers 17, to excite the ESD protection device in the ESD case to breakdown. For this reason, the p+ area 65 is omitted in the case of the ESD protection device of FIG. 5b. Whereas in FIG. 5b, in contrast to FIG. 5a, the first terminal or $V_{DD}$ is connected directly to the n+ area 61, the second terminal or $V_{SS}$ is connected to the p+ area 66 via the PMOS transistor 5. In the case of the embodiment shown in FIG. 5b, therefore, the resistance of the connection to the p-well is controlled or switched via the PMOS transistor 5, which is controlled by the non-inverted ESD signal.

Figure 6A:
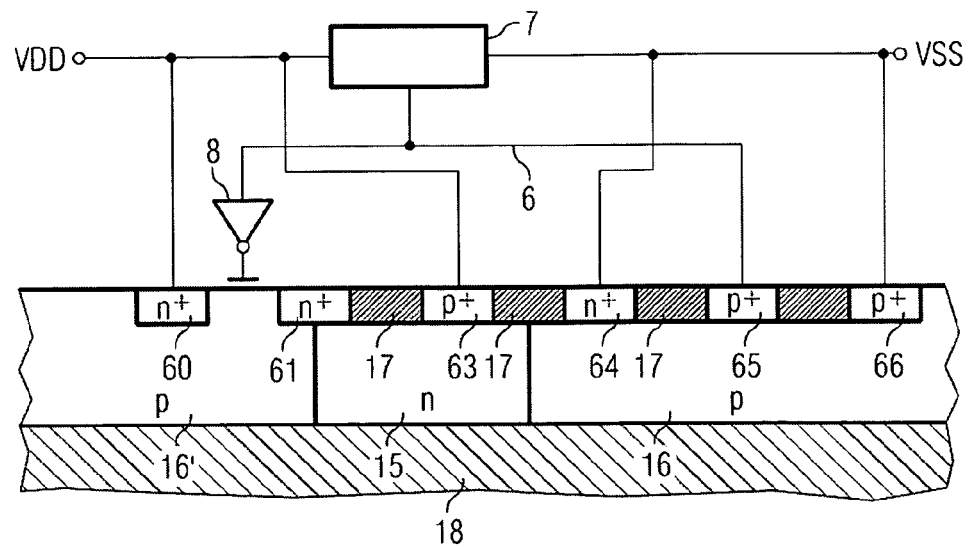
FIG. 6a-d show four embodiments of ESD protection devices according to the invention, a still greater part of these ESD protection devices being shown as semiconductor structures.

In FIG. 6a, the ESD protection device 19 or 20 shown in FIGS. 4a and 5a is shown, a still greater part of the ESD protection device being represented by semiconductor structures. Therefore, in the description of FIG. 6a only the differences and additions in relation to FIG. 5a are described.

In the case of the ESD protection device shown in FIG. 6a, to the left next to the n-well 15 there is a further p-well 16'. In the p-well 16', to the left an n+ area 60 is arranged, and is connected to the first terminal or $V_{DD}$. The n+ area 61 in the case of the embodiment of FIG. 6a, in contrast to the embodiment of FIG. 5a, is not arranged completely within the n-well 15, but is on the boundary between the p-well 16' and the n-well 15, and is arranged in such a way that the n+ area 61 is partly in the p-well 16' and the remaining part is in the n-well 15. Thus, the ESD protection device shown in FIG. 6a is in an advantageous compact structure. The inverted ESD signal 6 is connected to an area between the n+ area 60 and the n+ area 61.

Figure 6B:
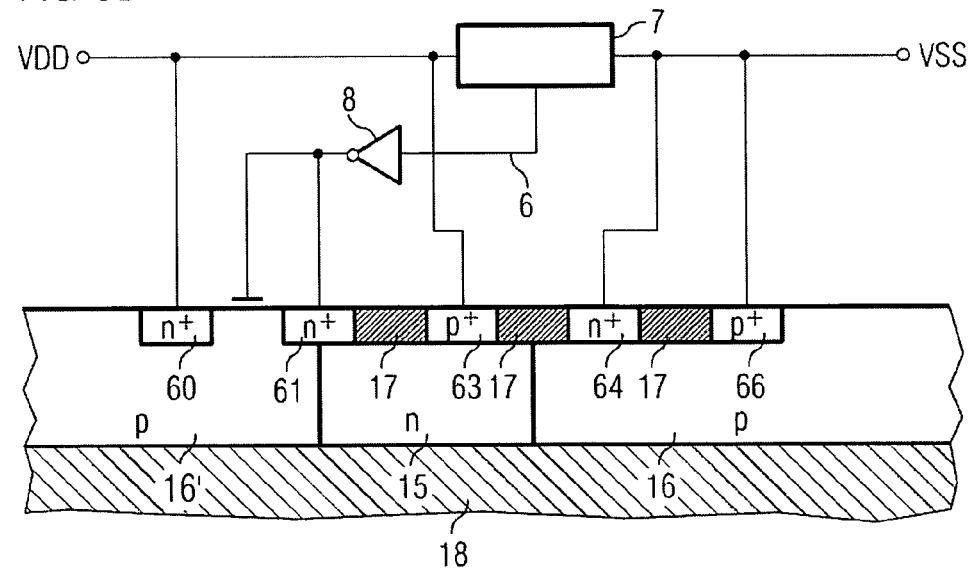
Figure 6C:
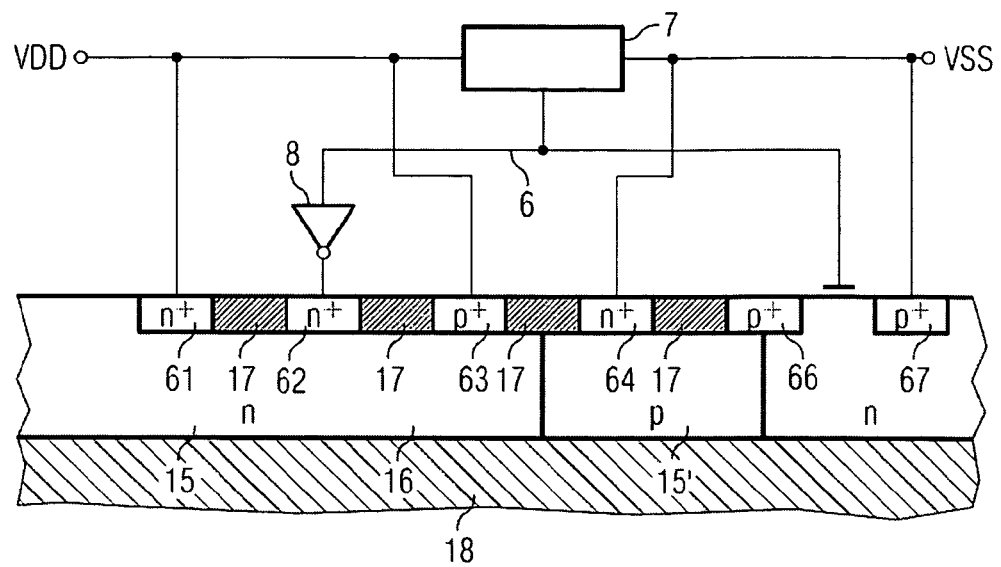
Figure 6D:
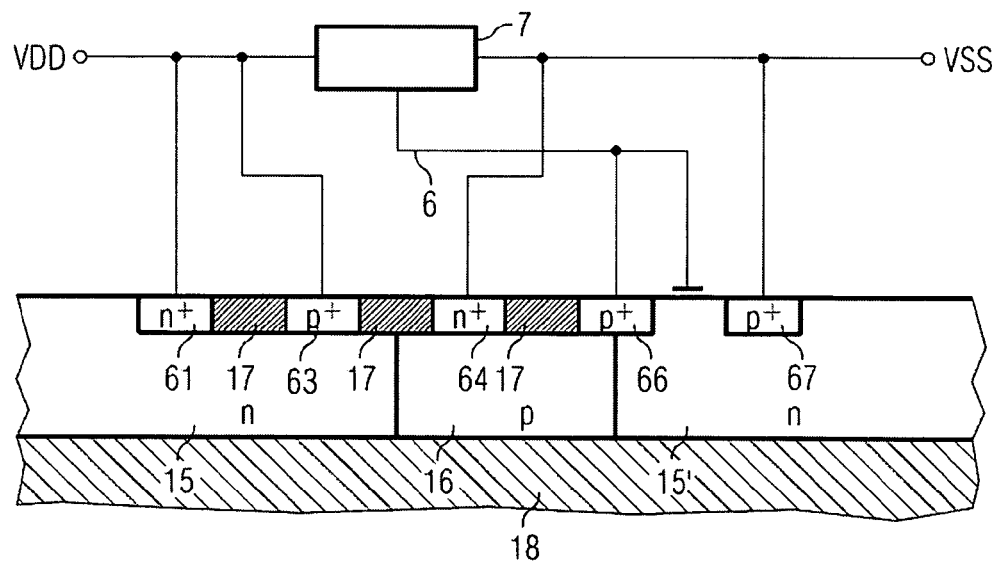
Figure 6E:
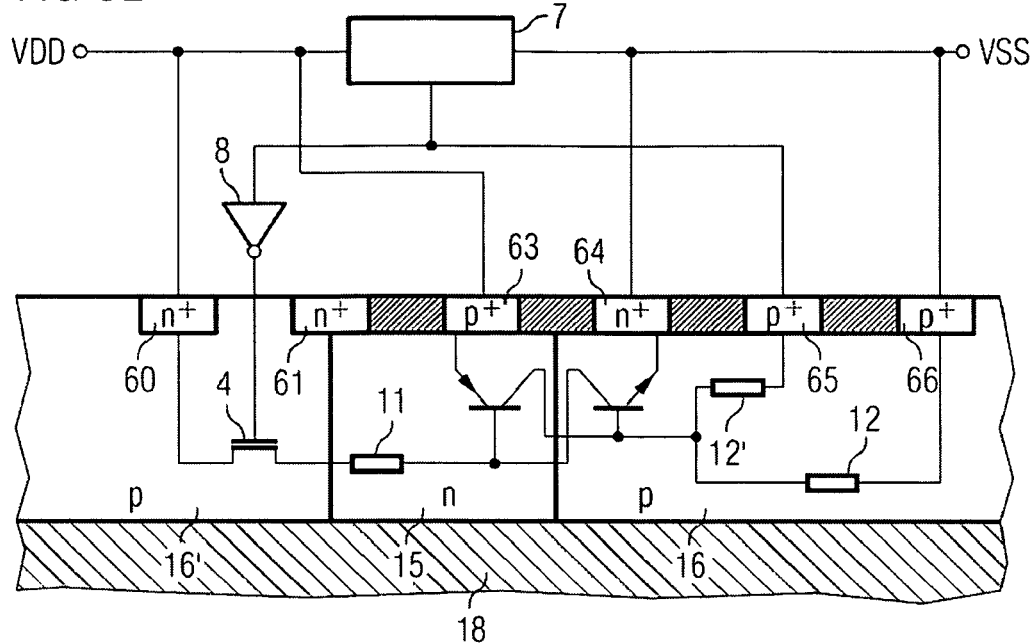
FIG. 6e shows the embodiments of FIG. 6a, the components which are formed by the semiconductor components being additionally shown schematically.

In FIG. 6e, the ESD protection device shown in FIG. 6a is shown again, and which components are formed by the semiconductor layers is also shown schematically. It can be seen that between the n+ area 60 and the n+ area 61 the NMOS transistor 4 is formed, and that between the NMOS transistor 4 and the base of the PNP transistor the n-well resistor 11 is formed. Between the p+ area 66 and the p+ area 65 and the base of the NPN transistor, the p-well resistor 12 and a further p-well resistor 12' are formed. FIG. 6e shows the advantageous compact structure of the ESD protection device, for instance the n-well 15 forms on the one hand the base of the PNP transistor and on the other hand the collector of the NPN transistor, whereas the p-well 16 forms on the one hand the base of the NPN transistor and on the other hand the collector of the PNP transistor.

The embodiment of FIG. 6b of an ESD protection device is related to the embodiment shown in FIG. 6a, where differences are discussed below. Whereas the ESD protection device shown in FIG. 6a is excited to breakdown in the ESD case by the ESD signal 6 being fed to the p+ area 65, the ESD signal 6 that is inverted by the inverter 8 in FIG. 6b is fed to the n+ area 61 to cause the breakdown of the thyristor circuit in the ESD case. Therefore, in FIG. 6b, the p+ area 65 is unnecessary, resulting in an even more compact structure.

In FIG. 6c, the ESD protection device shown in FIG. 5b is shown, further semiconductor structures being shown. Therefore, only the additions to FIG. 5b are explained. Whereas the p+ area 66 in FIG. 5b is arranged within the p-well 16, the p+ area 66 in FIG. 6c is both within the p-well 16 and also within a further n-well 15', which is arranged on the right next to the p-well 16. Separately from the p+ area 66, a p+ area 67 is arranged, and is connected to the second terminal or $V_{SS}$. The ESD signal 6 is connected to an area between the p+ area 66 and the p+ area 67, so that the PMOS transistor 5 is formed from the p+ area 67 to the p+ area 66. Thus in the case of the embodiment shown in FIG. 6c, the PMOS transistor 5 connects a resistance between the p-well 16 and the second terminal or $V_{SS}$. To excite a breakdown of the thyristor circuit in the ESD case, in FIG. 6c the inverted ESD signal 6 is fed to the n+ area 62.

In FIG. 6d, an embodiment of the ESD protection device related to the embodiment shown in FIG. 6c is shown, for which reason only the differences are explained below. Whereas the inverted ESD signal 6 in FIG. 6c is fed to the n+ area 62, in FIG. 6d the ESD signal 6 is fed to the p+ area 66 to excite a breakdown in the ESD case. Because the embodiment shown in FIG. 6d does not require an inverter 8 for the ESD signal 6, the embodiment shown in FIG. 6d is even more compact than the embodiment of the ESD protection device shown in FIG. 6b.

Figure 7:
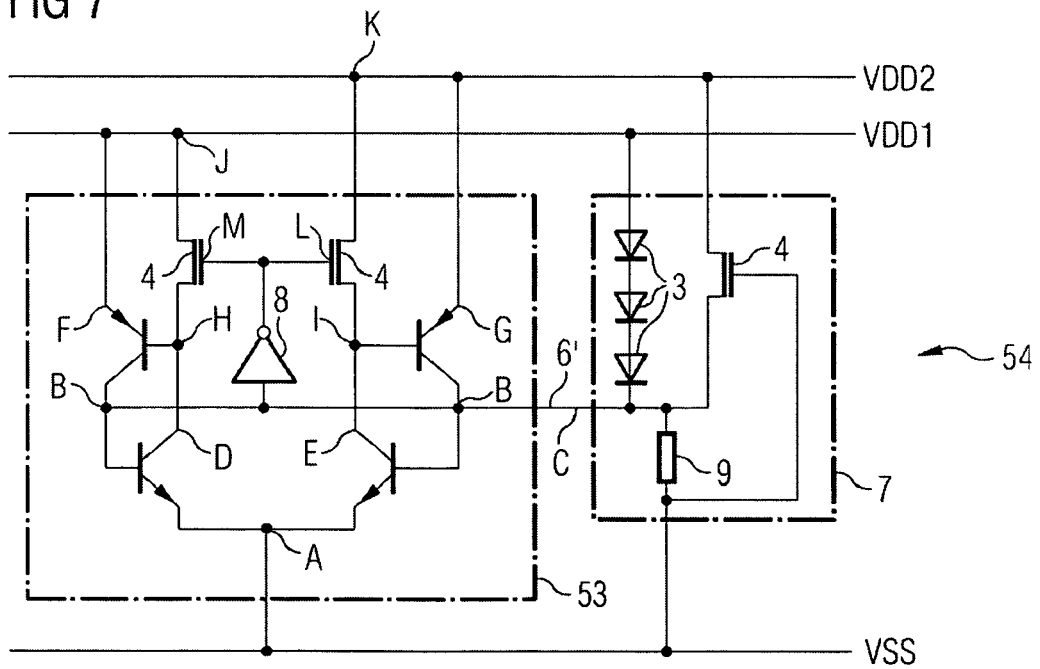
FIG. 7 shows an ESD protection arrangement according to the invention, including two thyristor circuits or ESD protection devices.

FIG. 7 shows an ESD protection arrangement 53 or 54, including two thyristor circuits. The ESD protection arrangement 54 includes a control device 7 that generates a further ESD signal 6', whereas the ESD protection arrangement 53 does not have its own control device 7, for which reason the further ESD signal 6' is fed from outside to the ESD protection arrangement 53. The control device 7 captures both the ESD case between $V_{DD1}$ and $V_{SS}$ and also the ESD case between $V_{DD2}$ and $V_{SS}$. In both cases, the control device 7 sets the further ESD signal 6' to a high potential (binary value 1), whereas the control device 7 sets the further ESD signal 6' to a low potential (binary value 0), almost corresponding to $V_{SS}$, if neither the ESD case between $V_{DD1}$ and $V_{SS}$ nor the ESD case between $V_{DD2}$ and $V_{SS}$ is present. $V_{DD1}$ can be, for instance, a low supply voltage in the range between 1 and 1.5 Volts, and $V_{DD2}$ can be a higher supply voltage in the range between 3 and 5 Volts.

The ESD protection arrangement 53 includes, in principle, two ESD protection devices 19, as they are set out in FIG. 4a. Only the inverter 8 is present only once in the ESD protection arrangement 53, and is not present once for each of the two ESD protection devices 19. For clarity, the well resistors 11, 12 shown in FIG. 4a are not shown in FIG. 7. Whereas the ESD protection device which is arranged on the left in FIG. 7 is between $V_{DD1}$ and $V_{SS}$, the ESD protection device which is arranged on the right in FIG. 7 is between $V_{DD2}$ and $V_{SS}$. Because the further ESD signal 6' is fed to both ESD protection devices of the ESD protection arrangement 53, the two ESD protection devices are excited to breakdown even if the ESD case is present between $V_{DD1}$ and $V_{SS}$ only or between $V_{DD2}$ and $V_{SS}$ only. This special feature will be explained in more detail below on the basis of a scenario as an example.

Assume that a surge is present on the line carrying $V_{DD2}$, whereas on the line carrying $V_{DD1}$, no surge is present. In this case, the control device 7, in the branch which is formed by the NMOS transistor 4 and the resistor 9, captures the ESD case between $V_{DD2}$ and $V_{SS}$, so that the further ESD signal 6 is set to the binary value 1 (higher potential). Because both ESD protection devices of the ESD protection arrangement 53 are connected in the same way to the further ESD signal 6', both ESD protection devices are excited to become conductive or set to a low-resistance state, so that the surge is diverted. This means that although no direct ESD case exists between $V_{DD1}$, and $V_{SS}$, nevertheless the ESD protection device which is arranged between $V_{DD1}$ and $V_{SS}$ is switched to low-resistance. This is an advantage to protect complex circuits, to which both $V_{DD1}$ and $V_{DD2}$ and $V_{SS}$ are fed. In the ESD case, in the case of this type of circuit, the result is usually a surge both between $V_{SS2}$ and $V_{DD}$ and between $V_{SS1}$ and $V_{DD}$. It is therefore advantageous also to switch the ESD protection device which is arranged between $V_{DD1}$ and $V_{SS}$ to low-resistance, even if at this moment no ESD case has (yet) been detected between $V_{DD1}$, and $V_{SS}$.

Figure 8:
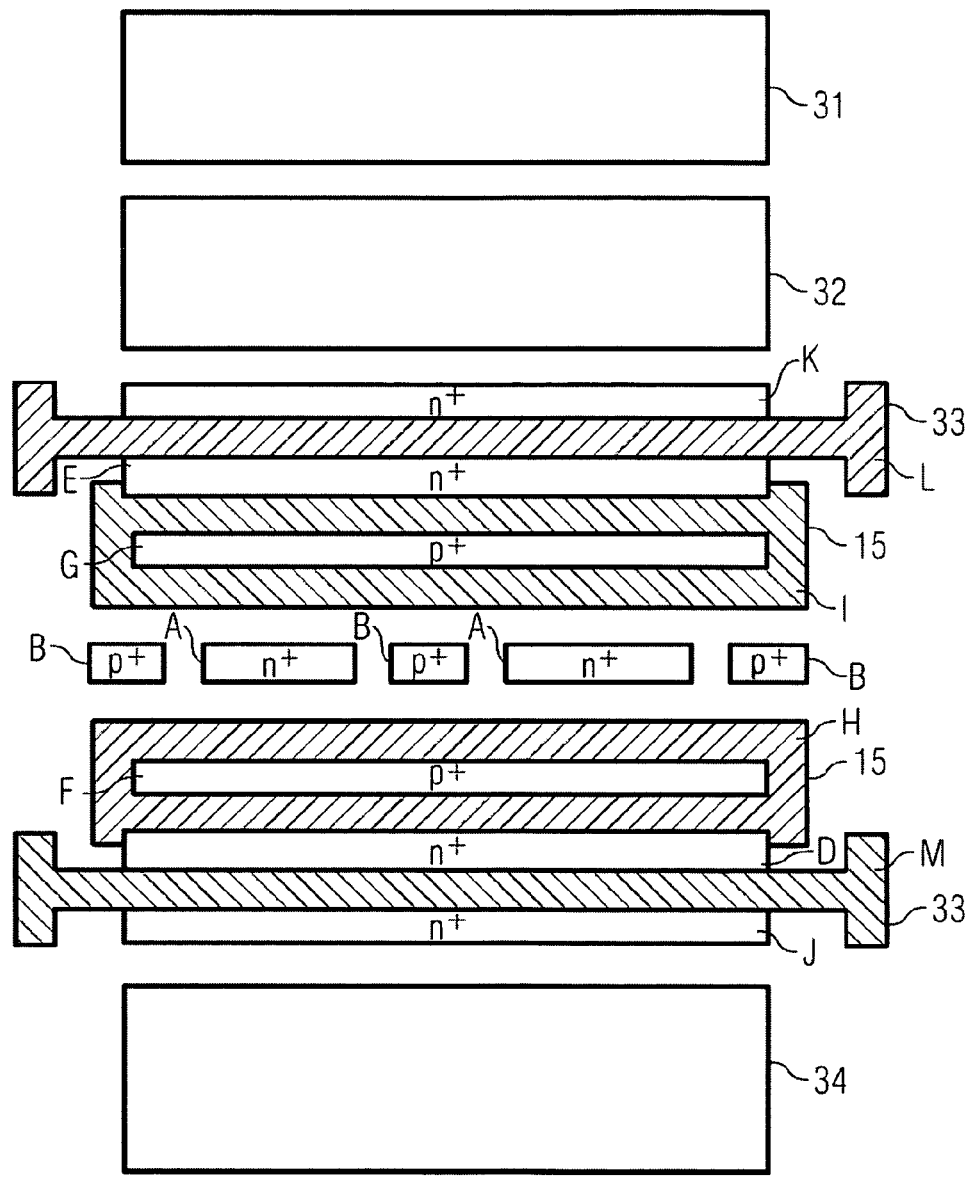
FIG. 8 shows the ESD protection arrangement shown in FIG. 7, with semiconductor structures which are arranged according to the invention.

FIG. 8 shows how the ESD protection arrangement 53 shown in FIG. 7 can be advantageously arranged compactly as a semiconductor structure, the inverter 8 being omitted for representational reasons. To simplify the relationship between FIG. 7 and FIG. 8, reference symbols A-M are introduced into both FIG. 7 and FIG. 8 at related points. The embodiment of an ESD protection arrangement shown in FIG. 8 is distinguished by an area-efficient layout, and is used, for instance, as a power clamp. The embodiment shown here is arranged in a typical input/output cell.

In FIG. 8, two n-wells 15, separated by an arrangement consisting of three p+ areas B and two n+ areas A, are arranged one on top of the other, the lower n-well 15 having an n-well contact H and the upper n-well 15 having an n-well contact I. The three p+ areas and two n+ areas are arranged next to each other in an alignment from left to right. Within the upper n-well 15, there is a p+ area G, and within the lower n-well 15, there is a p+ area F. Above the p+ area G and below the p+ area F, there is an n+ area E and D respectively, and it is arranged partly within the n-well 15 and partly outside the n-well 15. The upper n+ area E is joined to a polysilicon layer 33 or L followed by another n+ area K, and similarly the lower n+ area D is joined to a polysilicon layer 33 or M followed by another n+ area J.

It should be noted that the n-wells 15 can extend to a limit of the input/output cell to form a continuous n-well protective ring around the input/output cell. Also, in the case of the arrangement between the two n-wells, instead of the periodically alternating p+ areas B and n+ areas A, a repeating sequence of sub-arrangements can be arranged, each sub-arrangement consisting of two n+ areas separated by a p+ area.

The polysilicon layers 33 form the control inputs L and M of the NMOS transistors which connect the resistance to the appropriate n-well 15 (i.e., they are connected to the inverted further ESD signal 6' (not shown)). To excite a breakdown in the ESD case, the further ESD signal 6' is fed in at B. The supply voltage $V_{DD1}$ (1 to 1.5 Volts) is fed in at J and F, whereas the supply voltage $V_{DD2}$ (3 to 5 Volts) is fed in at K and G. The supply voltage $V_{SS}$ (earth) is connected to A.

Above the ESD protection arrangement in FIG. 8, the NFET driver 31 and the PFET driver 32, which both work with $V_{DD2}$, are arranged, whereas below the ESD protection arrangement a logic part, to which $V_{DD1}$ is supplied, is arranged.

The ESD protection arrangement shown in FIG. 8 offers the following advantages:

Both thyristor circuits or ESD protection devices divide the arrangement (which is arranged between the n-wells 15) of p+ areas B and n+ areas A.

The n+ areas D and E are used, on the one hand, to create a contact to the corresponding n-well for the corresponding thyristor, and on the other hand as the source area of the corresponding NMOS transistor.

The n-wells 15 secure the supply voltages $V_{DD1}$ at F and $V_{DD2}$ at G against $V_{SS}$ (earth) and against the other supply voltage in each case.

Figure 9:
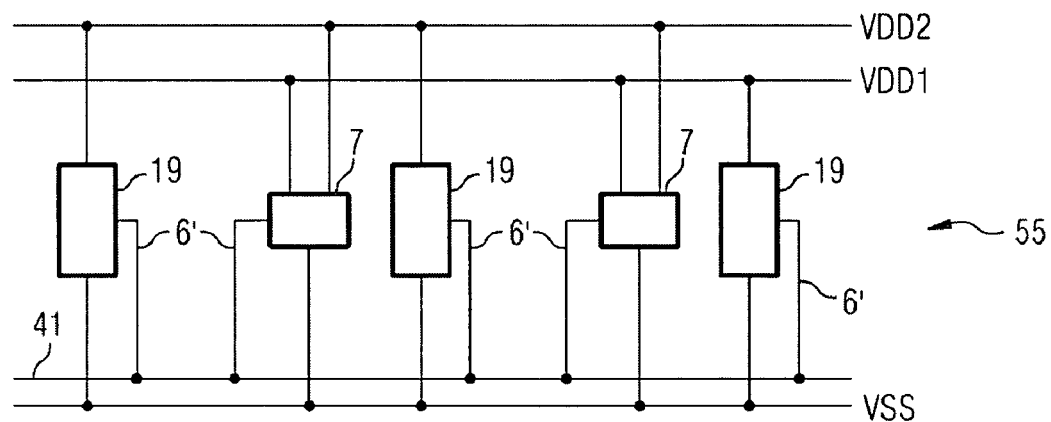
FIG. 9 shows an ESD protection system according to the invention.

FIG. 9 shows an ESD protection system 55 which protects a semiconductor circuit (not shown) from an electrostatic discharge. The protected semiconductor circuit is supplied by the supply voltage potentials $V_{DD1}$, $V_{DD2}$ and $V_{SS}$. The ESD protection system 55 has two control devices 7, three ESD protection arrangements or ESD protection devices 19 and an ESD signal bus 41. Each control device 7 feeds the further ESD signal 6' to the ESD signal bus 41, whereas each ESD protection device 19 taps the further ESD signal 6' from the ESD signal bus 41. If the ESD case occurs between $V_{DD1}$ and $V_{SS}$ or between $V_{DD2}$ and $V_{SS}$, this is captured by the control devices 7, which communicate corresponding information using the further ESD signal 6' to the ESD protection devices 19. The ESD protection devices 19 then come into a low-resistance state, and divert the surge before the circuit to be protected (not shown) is damaged.

Whereas in the case of the embodiment of the ESD protection system 55 shown in FIG. 9 only ESD protection arrangements or ESD protection devices 19 which are each arranged between two lines are shown, the ESD protection system 55 can obviously have one or more ESD protection arrangements, which are arranged between $V_{DD1}$ and $V_{DD2}$ and $V_{SS}$, so that such an ESD protection arrangement then, in the ESD case, ensures a low-resistance connection both between $V_{DD1}$ and $V_{SS}$ and between $V_{DD2}$ and $V_{SS}$.

The control devices 7 and ESD protection devices 19 or ESD protection arrangements can be arranged anywhere in the supply network consisting of the lines carrying $V_{DD1}$, $V_{DD2}$ and $V_{SS}$. A signal strength of the further ESD signal 6' on the ESD signal bus 41, which is necessary to control the ESD protection arrangements or ESD protection devices 19, and a driver capability of the control devices 7 (i.e., a signal strength with which the appropriate control device 7 generates the further ESD signal 6') is taken into account. The control devices 7 should be arranged where there is a circuit part, which is sensitive to ESD, of the circuit to be protected.

Figure 10:
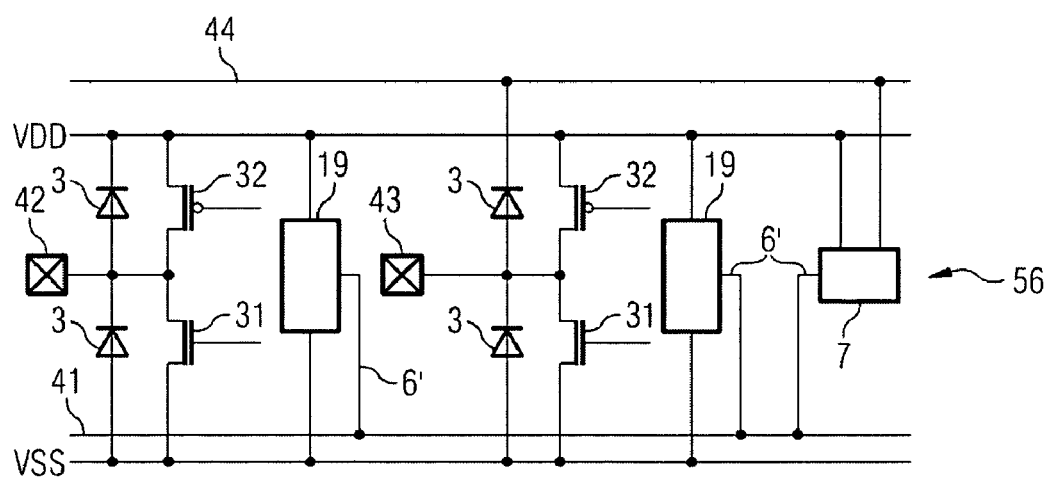
FIG. 10 shows an ESD protection system according to the invention, with two input/output arrangements.

In FIG. 10, another embodiment of an ESD protection system 56 is shown. The ESD protection system 56 protects, on the one hand, an input/output terminal 42 of a circuit which is intolerant to surges, and on the other hand, an input/output terminal 43 of a circuit which is tolerant to surges. A circuit which is intolerant to surges is understood to be a circuit which is not designed so that it copes with a potential higher than its supply voltage potential ($V_{DD}$) at its input/output terminal. In contrast, a circuit which is tolerant to surges copes with a potential higher than its supply voltage potential ($V_{DD}$) at its input/output terminal.

The ESD protection system 56 comprises a control device 7, two ESD protection devices 19, one ESD signal bus 41 and a floating bus 44. Between $V_{SS}$ and the terminal 42 and between terminal 42 and $V_{DD}$, in each case a diode 3 is connected in the forward direction, so that, if a potential which is present at the terminal 42 is between $V_{SS}$ and $V_{DD}$, there is no current flow through the diodes 3 to record. Additionally, an NFET driver transistor 31 is connected between $V_{SS}$ and the terminal 42, and a PFET driver transistor 32 is connected between the terminal 42 and $V_{DD}$. These two driver transistors 31, 32 go into action alternately if the terminal 42 is operated as output. The input/output terminal 43 differs from the input/output terminal 42 only in that the upper diode 3 is not connected to $V_{DD}$ but to the floating bus 44.

If a surge or potential which is greater than $V_{DD}$ now occurs at the terminal 42, the upper diode 3 becomes conducting, so that the surge which is present at the terminal 42 is diverted to the line carrying $V_{DD}$. This surge on the line carrying $V_{DD}$ is captured by the control device 7, which sets the further ESD signal 6' accordingly. The two ESD protection devices 19 then come into the low-resistance state, so that the surge on the line carrying $V_{DD}$ is diverted by the left-hand ESD protection device to the line carrying $V_{SS}$. In the case of the terminal 43, which belongs to a circuit (not shown) which is tolerant to surges, a surge which is present at the terminal 43 is diverted via the upper diode 3 to the floating bus 44. This surge is also captured by the control device 7, which in turn sets the further ESD signal 6' accordingly, so that the surge on the line carrying $V_{SS}$ is diverted by the right-hand ESD protection device 19.

Figure 11:
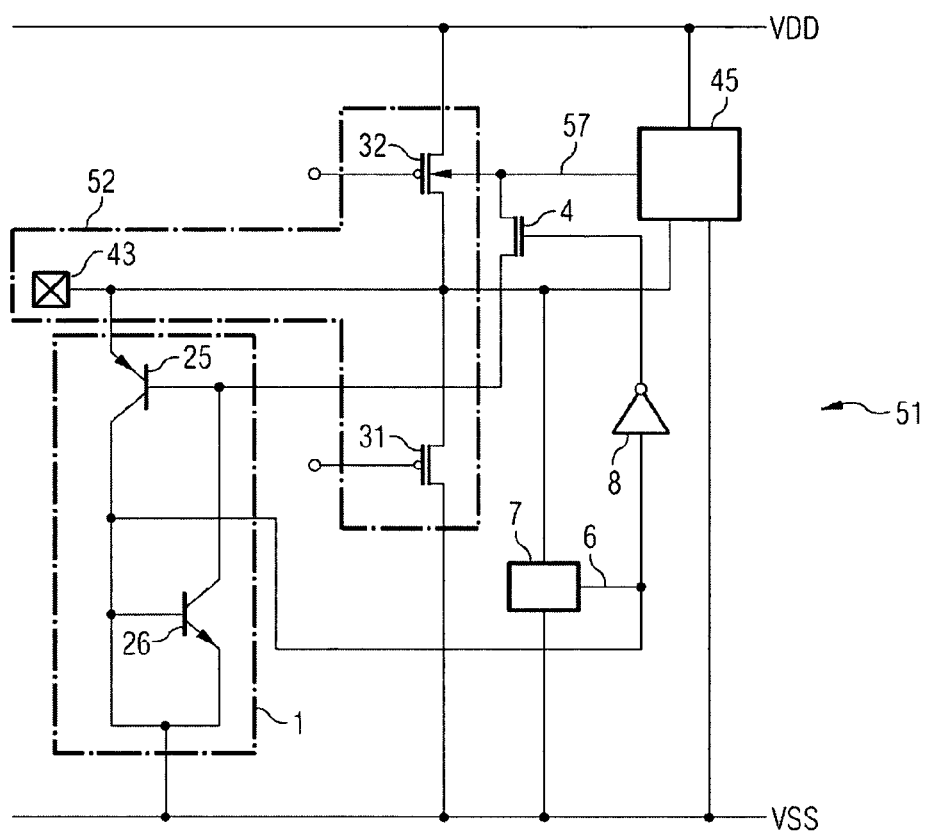
FIG. 11 shows an ESD protection device according to the invention, with a well control circuit.

In FIG. 11, an ESD protection device 51 which includes a well control circuit 45 is shown. The ESD protection device 51 includes an input/output arrangement 52, a thyristor circuit 1, a control device 7, an NMOS transistor 4 and a well control circuit 45. The input/output arrangement 52 has an input/output terminal 43, a PFET driver transistor 32, which switches a connection between the terminal 43 and the supply voltage $V_{DD}$, and an NFET driver transistor 31, which switches a connection between the terminal 43 and the supply voltage $V_{SS}$. The thyristor circuit 1 consists of a PNP transistor 25 and an NPN transistor 26, the emitter of the PNP transistor 25 being connected to the terminal 43. The collector of the PNP transistor 25 is connected to the base of the NPN transistor 26, to the emitter of the NPN transistor 26, to $V_{SS}$ and to the ESD signal which is output by the control device 7. The well control circuit 45 is connected to the terminal 43, to $V_{DD}$ and to $V_{SS}$, and on the output side outputs a well control signal 57, which receives as potential the maximum of $V_{DD}$ and a potential which is present at the terminal 43. The well control signal 57, on the one hand, controls a well potential of the PFET driver transistor 32, and on the other hand, is connected via the NMOS transistor 4 and the n-well resistor (not shown) to the base of the PNP transistor 25 and the collector of the NPN transistor 26.

The ESD protection device shown in FIG. 11 is used, in particular, in the case of semiconductor circuits, in which in normal operating states connecting the well contacts directly to the supply voltage line $V_{DD}$ is forbidden. This applies, for instance, to n-wells of an input/output terminal of a circuit which is tolerant to surges. In the case of such semiconductor circuits, according to the prior art adjusting the well potential of the driver transistors by a particular well control circuit is known. In the case of the ESD protection device 51 shown in FIG. 11, this well control circuit 45 is now additionally used to adjust the potential of the n-well of the thyristor circuit 1. Between the well control signal 57 and the n-well contact of the thyristor circuit 1, the NMOS transistor 4 is connected, to change or switch the n-well resistance of the thyristor circuit 1, as is known from previously described embodiments.

The invention claimed is:

1. An electrostatic discharge ("ESD") protection device, adapted to be connected between a first line and a second line, the ESD protection comprising:
   a thyristor connected to the first line and to the second line, where the ESD protection device is configured to detect the ESD case by means of an ESD signal, and to raise a resistance of the ESD protection device in comparison with the non-ESD case when the ESD protection device detects the ESD case by means of the ESD signal, the ESD signal being received by the ESD protection device and having a value based on whether an ESD case occurs between the first and the second line, the value of the signal when an ESD case occurs being different from a value when there is no ESD case.

2. The ESD protection device of claim 1, further comprising a switch arranged between at least one of a first terminal and second terminal of the thyristor and a point within the thyristor, where the switch is controlled to open in the ESD case and close in the non-ESD case.

3. The ESD protection device of claim 2, where the thyristor comprises:
   a first transistor of a first conduction type; and
   a second transistor of a second conduction type being different from the first conduction type, the first terminal of the thyristor being connected to an emitter terminal of the first transistor, and via a switch of the ESD protection device to a control input of the first transistor and to a collector terminal of the second transistor, a collector terminal of the first transistor being connected to a control input of the second transistor, the second terminal of the thyristor and an emitter terminal, of the second transistor,
   where the switch is controlled to open in the ESD case by the ESD signal, and the thyristor is controlled by the ESD signal to become conductive, and the switch is controlled to close in the non-LSD case by the ESD signal.

4. The ESD protection device of claim 2, where the thyristor comprises:
   a first transistor of a first conduction type; and
   a second transistor of a second conduction type being different from the first conduction type, the first terminal of the thyristor being connected to an emitter terminal of the first transistor, to a control input of the first transistor, and to a collector terminal of the second transistor, the second terminal of the thyristor being connected to an emitter terminal of the second transistor, and via a switch of the ESD protection device to a collector terminal of the first transistor, and to a control input of the second transistor,
   where the switch is controlled to open in the ESD case by the ESD signal, and the thyristor is controlled by the ESD signal to become conductive, and the switch is controlled to close in the non-ESD case by the ESD signal.

5. The ESD protection device of claim 2, where the switch comprises a transistor having a common n+ area with the thyristor.

6. The ESD protection device of claim 5, having a p-substrate with an n-well adjacent to a first p-well and a second p-well, the first p-well comprising:

a first n+ area connectable to the first line, and
a second n+ area being arranged both within the first p-well and
within the n-well to feed an inverted ESD signal between the first and second n+ areas;
where the n-well includes, insulated to the second n+ area, a first p+ area connectable to the first line, and
where the second p-well includes a third n+ area connectable to the second line, a second p+ area, being insulated from the third n+ area and connectable to the ESD signal, and a third p+ area being insulated from the third n+ area and from the second p+ area and connectable to the second line.

7. The ESD protection device of claim 5, having a p-substrate having an n-well adjacent to a first p-well and a second p-well, the first p-well comprising:
a first n+ area connectable to the first line, and
a second n+ area, being insulated from the first n+ area, and arranged both within the first p-well and within the n-well, to receive an
inverted ESD signal, and to feed the inverted ESD signal between the first and second n+ areas,
where the n-well includes, insulated to the second n+ area, a first p+ area, connectable to the first line, and
where the second p-well includes a third n+ area connectable to the second line, and a second p+ area, being insulated from the third n+ area, and connectable to the second line.

8. The ESD protection device of claim 5, where the transistor and thyristor comprise a common p+ area.

9. The ESD protection device of claim 5, having a p-substrate having a p-well adjacent to a first n-well and a second n-well, the first n-well comprising:
a first n+ area connectable to the first line,
a second n+ area being insulated from the first n+ area and to which an inverted ESD signal can be fed, and
a first p+ area, being insulated from the first and second n+ areas and connectable to the first line,
where the p-well includes a third n+ area connectable to the second line, a second p+ area, being insulated from the third n+ area, and arranged within the p-well and within the second n-well, and
where the second n-well includes a third p+ area being insulated from the second p+ area and connectable to the second line to feed the ESD signal between the second and third p+ areas.

10. The ESD protection device of claim 5, having a p-substrate having a p-well adjacent to a first n-well and a second n-well, the first n-well comprising:
a first n+ area connectable to the first line,
a first p+ area insulated from the first n+ area and connectable to the first line,
where the p-well includes a second n+ area connectable to the second line, a second p+ area being insulated from the second n+ area and arranged both within the p-well and within the second n-well, where the ESD signal is received at the second p+ area, and
where the second n-well includes a third p+ area connectable to the second line to feed the ESD signal between the second and third p+ areas.

11. The ESD protection device of claim 1, where a potential of the first line is greater than a potential of the second line.

12. The ESD protection device of claim 1, where the first line and second line comprise supply voltage lines.

13. The ESD protection device of claim 1, comprising a control device, configured to detect the ESD case between the first and second lines and to generate the ESD signal.

14. The ESD protection device of claim 13, having an input/output arrangement, the input/output arrangement comprising:
an input/output terminal connected to the first terminal of the first transistor;
a first driver transistor, the first line being connectable via the first driver transistor to the first terminal of the first transistor;
a second driver transistor; and
a control circuit having an output being connected to a well contact of the first driver transistor and via the switch to the control input of the first transistor and to the first terminal of the second transistor, the output providing a tap for a maximum of the potential of the first line and the potential of the input/output terminal,
where the control device is configured to detect the ESD case between the input/output device and the second line and to generate the ESD signal, and the input/output arrangement is connectable via the second driver transistor to the second line.

15. An electrostatic discharge ("ESD") protection arrangement, comprising:
at least one ESD protection device having a thyristor connected to a first line and to a second line, and configured to detect an ESD case based on an ESD signal, and to raise a resistance of the ESD protection device in comparison with the non-ESD case when the ESD protection device detects the ESD case based on the ESD signal, the ESD signal having a value based on whether an ESD case occurs between the first and the second line, the value of the signal when an ESD case occurs being different from a value when there is no ESD case,
where the ESD protection arrangement is arranged between at least one first line and the second line, the number of the at least one first lines being equal to a number of the at least one ESD protection devices, one of the at least one ESD protection devices being arranged between each of the at least one first lines and the second line, the ESD protection arrangement being responsive to a further ESD signal, the further ESD signal having a value according to a ESD case between any of the at least one first lines and the second line, the further ESD signal in the case of and ESD being different from a value when the ESD case does not occur between any of the at least one first lines and the second line, and
where the ESD protection arrangement is configured to feed to each ESD protection device the further ESD signal as the ESD signal of the ESI protection device.

16. The ESD protection arrangement of claim 15, comprising one first ESD protection device and one second ESD protection device.

17. The ESD protection arrangement of claim 16, comprising at least one n+ area and at least one p+ area common to the thyristor of the first ESD protection device and the thyristor of the second ESD protection device.

18. The ESD protection arrangement of claim 16, where an area of the first terminal of the first transistor of the first ESD protection device is substantially equal to an area of the first terminal of the first transistor of the second ESD protection device.

19. The ESD protection arrangement of claim 16, where an area of the control input of the second transistor of the first ESD protection device is equal to an area of the control input of the second transistor of the second ESD protection device.

20. The ESD protection arrangement of claim 16 being arranged between a first and a further first line and the second line, and having an arrangement in a direction from top to bottom comprising:
   (i) first n-well arranged at the top, and a second n-well below the first n-well, the first n-well and the second n-well separated by an arrangement,
   (ii) first n+ area connectable to the further first line arranged above the first n-well,
   (iii) second n+ area arranged below the first n+ area, part of which is integral with the first n-well and the rest outside the first n-well, and which is separated from the first n+ area by a first polysilicon gate area, to which an inverted further ESD signal can be fed,
   (iv) first p+ area connectable to the further first line arranged within the first n-well, below and separated from the second n+ area,
   (v) third n+ area connectable to the first line arranged below the second n+ well,
   (vi) fourth n+ area arranged above the third n+ area, part of the fourth n+ area being within the second n-well and the rest outside the second n-well, the fourth n+ area being separated from the third n+ area by a second polysilicon gate area configured to receive the inverted further ESD signal,
   (vii) second p+ area connectable to the first line arranged within the second n-well, above and separated from the fourth n+ area, and
   (viii) at least one third p+ area connectable to the further ESD signal, and at least one fifth n+ area connectable to the second line.

21. The ESD protection arrangement of claim 20, comprising the at least one third p+ area being adjacently arranged with the at least one fifth n+ area in a left-to-right direction.

22. The ESD protection arrangement of claim 15, where the potential of each first line is greater than the potential of the second line.

23. The ESD protection arrangement of claim 15, where each first line and the second fine comprise supply voltage lines.

24. The ESD protection arrangement of claim 15, comprising a control device configured to detect the ESD case between anyone of the at least one first lines and the second line and to generate the further ESD signal.

25. The ESD protection arrangement of claim 24 being arranged between two first lines and the second line, and the control device includes a number of diodes connected in series, a transistor and a resistor, the diodes being connected in a forward direction between one of the first lines and a first terminal of the resistor, the transistor being connected between another of the first lines and the first terminal of the resistor, a control terminal of the transistor and a second terminal of the resistor are connected to the second line, and the further ESD signal being provided at the first terminal of the resistor.

26. An electrostatic discharge ("ESD") protection system, comprising:
   at least one ESD protection arrangement having at least one ESD protection device with a thyristor connected to a first line and to a second line, the ESD protection device configured In detect an ESD case based on an ESD signal, and to raise a resistance of the ESD protection device in comparison with the non-ESD case when the ESD protection device detects the ESD case based on the ESD signal, the ESD signal having a value according to whether an ESD case occurs between the first and the second line, the value of the signal when an ESD case occurs being different from a value when there is no ESD case, the ESD protection arrangement being arranged between at least one first line and the second line,
   where the number of the at least one first lines is substantially the same as a number of the at least one ESD protection devices, one of the at least one ESD protection devices being arranged between each of the at least one first lines and the second line, the ESD protection arrangement being responsive to a further ESD signal having a value according to a ESD case between any of the at least one first lines and the second line, where the further ESD signal in the case of an ESD being different from a value when the ESD case does not occur between any of the at least one first lines and the second line, and
   where the ESD protection arrangement feeds the further ESD signal to each ESD protection device as the ESD signal for the ESD protection device, at least one ESD protection arrangement being arranged between each of the at least one first lines and the second line, and
   where each ESD protection arrangement is connected to a bus via which the further ESD signal is fed to each ESD protection arrangement.

27. The ESD protection system of claim 26, comprising at least one control device configured to detect the ESD case between anyone of the at least one first lines and the second line and to generate the further ESD signal, the further ESD signal being provided onto the bus.

28. The ESD protection system of claim 26, having a first input/output arrangement comprising:
   a driver transistor;
   a first diode;
   a second diode; and
   an input/output terminal connected to an anode terminal of the first diode and a cathode terminal of the second diode and connectable via the driver transistor and a cathode terminal of the first diode to one of the at least one first lines, an anode terminal of the second diode being connectable to the second line.

29. The ESD protection system of claim 26, where the at least one first line has at least two first lines, and the ESD protection system includes a second input/output arrangement comprising:
   a driver transistor;
   a first diode having a cathode terminal being connectable to another of the at least one first lines;
   a second diode having an anode terminal being connectable to the second line; and
   an input/output terminal connected to the anode terminal of the first diode and the cathode terminal of the second diode, the input/output terminal. being connectable via the driver transistor to one of the at least one fist lines.

30. The ESD protection system of claim 29, where the other of the at least one first lines is a floating bus line of the ESD protection system.

31. A semiconductor circuit having an electrostatic discharge ("ESD") protection device connected between a first line and a second line of the semiconductor circuit the ESD protection comprising:
   a thyristor connected to the first line and to the second line, where the ESD protection device is configured to detect the ESD case by means of an ESD signal, and to raise a resistance of the ESD protection device in comparison with the non-ESD case when the ESD protection device detects the ESD case by means of the ESD signal, the ESD signal being received by the ESD protection device and having a value based on whether an ESD case occurs between the first and the second line, the value of the signal when an ESD case occurs being different from a value when there is no ESD case.

32. The semiconductor circuit of claim 31, further comprising a switch arranged between at least one of a first terminal and second terminal of the thyristor and a point within the thyristor, where the switch is controlled to open in the ESD case and close in the non-ESD case.

33. The semiconductor circuit of claim 32, where the thyristor comprises:
    a first transistor of a first conduction type; and
    a second transistor of a second conduction type being different from the first conduction type, the first terminal of the thyristor being connected to an emitter terminal of the first transistor, and via a switch of the ESD protection device to a control input of the first transistor and to a collector terminal of the second transistor, a collector terminal of the first transistor being connected to a control input of the second transistor, the second terminal of the thyristor and an emitter terminal, of the second transistor,
    where the switch is controlled to open in the ESD case by the ESD signal, and the thyristor is controlled by the ESD signal to become conductive, and the switch is controlled to close in the non-ESD case by the ESD signal.

34. The ESD protection device of claim 32, where the thyristor comprises:
    a first transistor of a first conduction type; and
    a second transistor of a second conduction type being different from the first conduction type, the first terminal of the thyristor being connected to an emitter terminal of the first transistor, to a control input of the first transistor, and to a collector terminal of the second transistor, the second terminal of the thyristor being connected to an emitter terminal of the second transistor, and via a switch of the ESD protection device to a collector terminal of the first transistor, and to a control input of the second transistor,
    where the switch is controlled to open in the ESD case by the ESD signal, and the thyristor is controlled by the ESD signal to become conductive, and the switch is controlled to close in the non-ESD case by the ESD signal.

35. A semiconductor circuit having an electrostatic discharge ("ESD") protection arrangement connected between a first line and a second line of the semiconductor circuit, the ESD protection arrangement comprising:
    at least one ESD protection device having a thyristor connected to a first line and to a second line, and configured to detect an ESD case based on an ESD signal, and to raise a resistance of the ESD protection device in comparison with the non-ESD case when the ESD protection device detects the ESD case based on the ESD signal, the ESD signal having a value based on whether an ESD case occurs between the first and the second line, the value of the signal when an ESD case occurs being different from a value when there is no ESD case,
    where the ESD protection arrangement is arranged between at least one first line and the second line, the number of the at least one first lines being equal to a number of the at least one ESD protection devices, one of the at least one ESD protection devices being arranged between each of the at least one first lines and the second line, the ESD protection arrangement being responsive to a further ESD signal, the further ESD signal having a value according to a ESD case between any of the at least one first lines and the second line, the further ESD signal in the case of and ESD being different from a value when the ESD case does not occur between arty of the at least one first lines and the second line, and
    where the ESD protection arrangement is configured to feed to each ESD protection device the further ESD signal as the ESD signal of the ESD protection device.

36. A semiconductor circuit having an electrostatic discharge ("ESD") protection system connected between a first line and a second line of the semiconductor circuit, the ESD protection system comprising:
    at least one ESD protection arrangement having at least one ESD protection device with a thyristor connected to a first line and to a second line, the ESD protection device configured to detect an ESD case based on an ESD signal, and to raise a resistance of the ESD protection device in comparison with the non-ESD case when the ESD protection device detects the ESD case based on the ESD signal, the ESD signal having a value according to whether an ESD case occurs between the first and the second line, the value of the signal when an ESD case occurs being different from a value when there is no ESD case, the ESD protection arrangement being arranged between at least one first line and the second line,
    where the number of the at least one first lines is substantially the same as a number of the at least one ESD protection devices, one of the at least one ESD protection devices being arranged between each of the at least one first lines and the second line, the ESD protection arrangement being responsive to a further ESD signal having a value according to a ESD case between any of the at least one first lines and the second line, where the further ESD signal in the case of an ESD being different from a value when the ESD case does not occur between any of the at least one first lines and the second line, and
    where the ESD protection arrangement feeds the further ESD signal to each ESD protection device as the ESD signal for the ESD protection device, at least one ESD protection arrangement being arranged between each of the at least one first lines and the second line, and
    where each ESD protection arrangement is connected to a bus via which the further ESD signal is fed to each ESD protection arrangement.

* * * * *

UNITED STATES PATENT AND TRADEMARK OFFICE
CERTIFICATE OF CORRECTION

PATENT NO. : 7,470,957 B2  Page 1 of 1
APPLICATION NO. : 11/324995
DATED : December 30, 2008
INVENTOR(S) : Harald Gossner It is certified that error appears in the above-identified patent and that said Letters Patent is hereby corrected as shown below:

In the Claims

In column 12, claim 3, line 42, after "to close in the" delete "non-LSD" and substitute --non-ESD-- in its place.

In column 13, claim 6, line 5, immediately after "and second n+ areas" delete ";" (semicolon) and substitute --,-- (comma) in its place.

In column 14, claim 15, line 52, after "ESD signal of the" delete "ESI" and substitute --ESD-- in its place.

In column 15, claim 26, line 63, before "detect an ESD case" delete "In" and substitute --to-- in its place.

In column 16, claim 29, line 52, immediately after "input/output terminal" delete "." (period).

In column 16, claim 29, line 53, after "of the at least one" delete "fist" and substitute --first-- in its place.

In column 17, claim 32, line 8, immediately after "the thyristor" delete "." (period).

Signed and Sealed this

Nineteenth Day of May, 2009

JOHN DOLL
*Acting Director of the United States Patent and Trademark Office*